United States Patent
Furuta et al.

(10) Patent No.: US 8,299,466 B2
(45) Date of Patent: Oct. 30, 2012

(54) THIN FILM TRANSISTORS HAVING MULTIPLE DOPED SILICON LAYERS

(75) Inventors: Gaku Furuta, Sunnyvale, CA (US); Soo Young Choi, Fremont, CA (US); Omori Kenji, Osaka (JP)

(73) Assignee: Applied Materials, Inc., Santa Clara, CA (US)

( * ) Notice: Subject to any disclaimer, the term of this patent is extended or adjusted under 35 U.S.C. 154(b) by 41 days.

(21) Appl. No.: 12/913,846

(22) Filed: Oct. 28, 2010

(65) Prior Publication Data
US 2011/0269274 A1     Nov. 3, 2011

Related U.S. Application Data

(60) Provisional application No. 61/257,750, filed on Nov. 3, 2009.

(51) Int. Cl.
*H01L 31/00* (2006.01)
(52) U.S. Cl. ....... 257/59; 257/57; 257/72; 257/E21.094; 257/E29.273; 438/149; 349/141
(58) Field of Classification Search ............... 257/52, 257/57, 59, 72, 66, 223, 291, 292, 439, 443, 257/655, E21.094, E29.273, E29.151; 438/149; 349/141
See application file for complete search history.

(56) References Cited

U.S. PATENT DOCUMENTS

| | | | |
|---|---|---|---|
| 5,825,050 A * | 10/1998 | Hirakawa | 257/57 |
| 2002/0164860 A1 | 11/2002 | Yang et al. | |
| 2002/0187592 A1 | 12/2002 | Wong | |
| 2006/0076562 A1* | 4/2006 | Lee et al. | 257/72 |
| 2010/0001272 A1 | 1/2010 | Ye | |
| 2010/0055850 A1* | 3/2010 | Chiang et al. | 438/155 |

FOREIGN PATENT DOCUMENTS

JP    07-058340 A    3/1995

OTHER PUBLICATIONS

International search report and written opinion for PCT/US2010/054505 dated Jun. 21, 2011.

\* cited by examiner

*Primary Examiner* — William D. Coleman
*Assistant Examiner* — Su Kim
(74) *Attorney, Agent, or Firm* — Patterson & Sheridan, LLP

(57) ABSTRACT

Embodiments of the present invention generally relate to a TFT and a method for its fabrication. The TFT disclosed herein is a silicon based TFT in which the active channel comprises amorphous silicon. Over the amorphous silicon, multiple layers of doped silicon are deposited in which the resistivity of the doped silicon layers is higher at the interface with the amorphous silicon layer as compared to the interface with the source and drain electrodes. Alternatively, a single doped silicon layer is deposited over the amorphous silicon in which the properties of the single doped layer change throughout the thickness. It is better to have a lower resistivity at the interface with the source and drain electrodes, but lower resistivity usually means less substrate throughput. By utilizing multiple or graded layers, low resistivity can be achieved. The embodiments disclosed herein include low resistivity without sacrificing substrate throughput.

8 Claims, 5 Drawing Sheets

THIN FILM TRANSISTORS HAVING MULTIPLE DOPED SILICON LAYERS

CROSS-REFERENCE TO RELATED APPLICATIONS

This application claims benefit of U.S. Provisional Patent Application Ser. No. 61/257,750, filed Nov. 3, 2009, which is herein incorporated by reference.

BACKGROUND OF THE INVENTION

1. Field of the Invention

Embodiments of the present invention generally relate to a thin film transistor (TFT) and a method for its fabrication.

2. Description of the Related Art

Liquid Crystal Displays (LCDs) are highly utilized in the flat panel display industry. In an LCD, two glass plates are joined together with a layer of liquid crystal material sandwiched therebetween. The substrates are connected to a power source to change the orientation of the liquid crystal material. TFTs have been used to separately address the pixels of the LCD at very fast rates. In the modern display panel, there are millions of pixels which each are separately addressed by a corresponding TFT.

One of the types of TFTs that is used in LCD manufacturing is a bottom gate TFT. A bottom gate TFT contains a gate electrode formed over a substrate, a gate dielectric layer formed over the gate electrode, an active material layer such as amorphous silicon, a doped silicon layer and source and drain electrodes. The active material permits the current to pass from the source to the drain electrode whenever the gate electrode is turned on. Once the current passes to the drain electrode, the pixel is addressed.

The resistivity of the doped silicon layer affects the efficiency of the TFT. The higher the resistivity, the lower the quality of the TFT. Usually, the doped silicon layer is not nearly as thick as the amorphous silicon layer. Therefore, the deposition time for the doped silicon layer is not typically a bottleneck in terms of substrate throughput. Because the doped silicon deposition is not typically a bottleneck, lowering the deposition rate for the doped silicon layer has been considered for depositing lower resistivity doped silicon layers. However, as the processing chambers become larger to produce larger LCDs, it is difficult to achieve both low resistivity across the entire substrate without lowering the deposition rate to such a level that bottlenecking occurs. In fact, the uniformity of the deposition suffers significantly between 400 Angstroms per minute and 1800 Angstroms per minute. As the chamber size gets larger, the deposition non-uniformity range continues to increase.

Therefore, there is a need for a TFT fabrication method that produces a doped silicon layer having both low resistivity and a high enough deposition rate that substrate bottlenecking does not occur.

SUMMARY OF THE INVENTION

Embodiments of the present invention generally relate to a TFT and a method for its fabrication. The TFT disclosed herein is a silicon based TFT in which the active channel comprises amorphous silicon. Over the amorphous silicon, multiple layers of doped silicon are deposited in which the resistivity of the doped silicon layers is higher at the interface with the amorphous silicon layer as compared to the interface with the source and drain electrodes. Alternatively, a single doped silicon layer is deposited over the amorphous silicon in which the properties of the single doped layer change throughout the thickness. It is better to have a lower resistivity at the interface with the source and drain electrodes, but lower resistivity usually means less substrate throughput. By utilizing multiple or graded layers, low resistivity can be achieved. The embodiments disclosed herein include low resistivity without sacrificing substrate throughput.

In one embodiment, a thin film transistor fabrication method is disclosed. The method includes depositing an amorphous silicon layer over a substrate having a gate electrode and a gate dielectric layer formed thereon. The method also includes depositing two or more doped silicon layers over the amorphous silicon layer. Each doped silicon layer has at least one characteristic that is different than the other doped silicon layers. The method also includes depositing a metal layer over the two or more doped silicon layers, patterning the metal layer to form a source electrode and a drain electrode and patterning the two or more doped silicon layers to expose the amorphous silicon layer. The method also includes depositing a passivation layer over the source electrode, the drain electrode and the exposed amorphous silicon layer.

In another embodiment, a thin film transistor fabrication method is disclosed. The method includes depositing an amorphous silicon layer over a substrate having a gate electrode and a gate dielectric layer formed thereon. The method also includes depositing a first doped silicon layer having a first resistivity on the amorphous silicon layer at a first deposition rate and depositing a second doped silicon layer having a second resistivity less than the first resistivity on the first doped silicon layer. The second doped silicon layer is deposited at a second deposition rate less than the first deposition rate. The method also includes depositing a metal layer over the second doped silicon layer, patterning the metal layer to form a source electrode and a drain electrode and patterning the first doped silicon layer and the second doped silicon layer to expose the amorphous silicon layer. The method also includes depositing a passivation layer over the source electrode, the drain electrode and the exposed amorphous silicon layer.

In another embodiment, a thin film transistor fabrication method is disclosed. The method includes depositing an amorphous silicon layer over a substrate having a gate electrode and a gate dielectric layer formed thereon. The method also includes depositing a doped silicon layer on the amorphous silicon layer. The doped silicon layer has a resistivity that decreases from a first surface in contact with the amorphous silicon layer to a second surface opposite the first surface. The method also includes depositing a metal layer on the second surface of the doped silicon layer, patterning the metal layer to form a source electrode and a drain electrode and patterning the doped silicon layer to expose the amorphous silicon layer. The method also includes depositing a passivation layer over the source electrode, the drain electrode and the exposed amorphous silicon layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
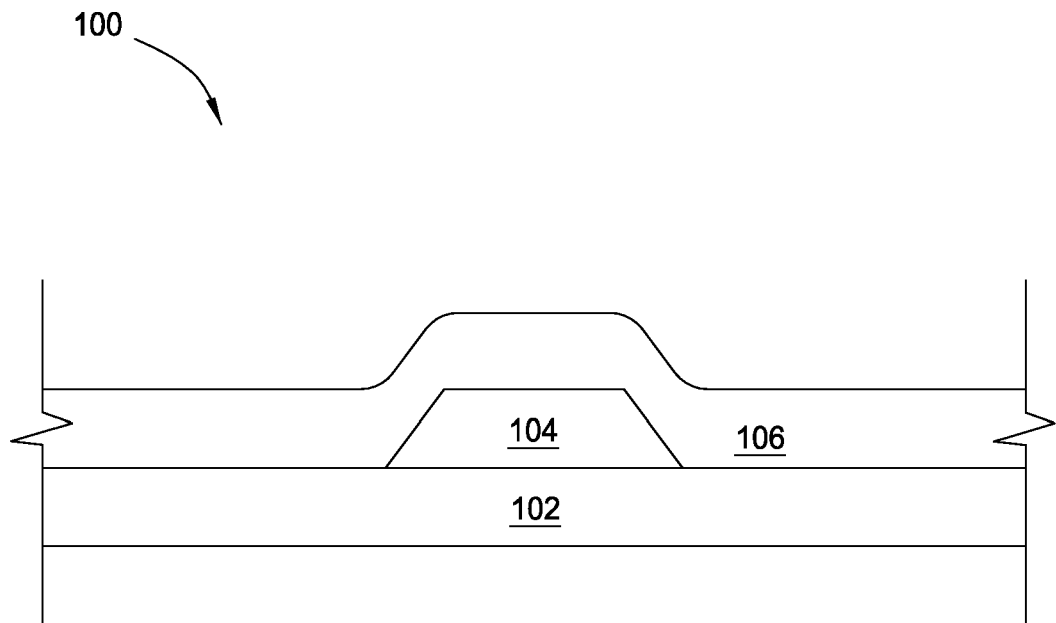
FIGS. 1A-1H are schematic cross-sectional views of a TFT structure 100 in various stages of production.
Figure 1B:
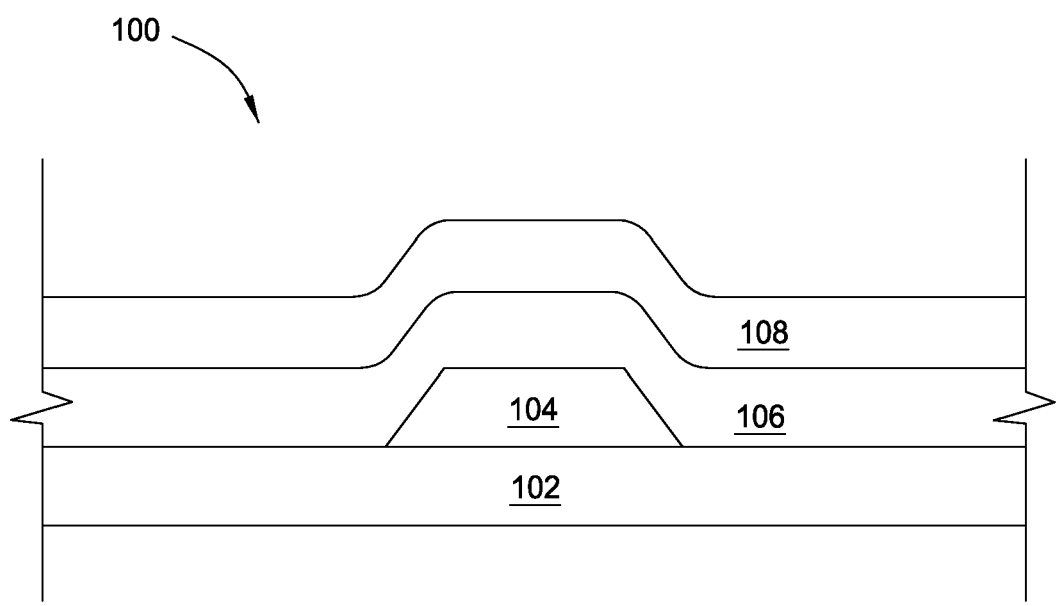

Embodiments of the present invention generally relate to a TFT and a method for its fabrication. The TFT disclosed herein is a silicon based TFT in which the active channel comprises amorphous silicon. Over the amorphous silicon, multiple layers of doped silicon are deposited in which the resistivity of the doped silicon layers is higher at the interface with the amorphous silicon layer as compared to the interface with the source and drain electrodes. Alternatively, a single doped silicon layer is deposited over the amorphous silicon in which the properties of the single doped layer change throughout the thickness. It is better to have a lower resistivity at the interface with the source and drain electrodes, but lower resistivity usually means less substrate throughput. By utilizing multiple or graded layers, low resistivity can be achieved. The embodiments disclosed herein include low resistivity without sacrificing substrate throughput.

The embodiments discussed herein may be practiced in a plasma enhanced chemical vapor deposition (PECVD) chamber manufactured and sold by AKT America, Inc., a subsidiary of Applied Materials, Inc., Santa Clara, Calif. It is to be understood that the embodiments discussed herein may be practiced in other chambers, including those sold by other manufacturers.

FIGS. 1A-1H are schematic cross-sectional views of a TFT structure 100 in various stages of production. The structure 100 includes a substrate 102. In one embodiment, the substrate 102 may comprise a semiconductor substrate. In another embodiment, the substrate 102 may comprise a silicon substrate. In another embodiment, the substrate 102 may comprise germanium. Over the substrate, a gate electrode 104 is formed. The gate electrode 104 is formed by blanket depositing a layer, forming a mask thereover, etching the layer and removing the mask to leave the gate electrode 104. In one embodiment, the gate electrode 104 may comprise a metal. In another embodiment, the gate electrode 104 may comprise a metal selected from the group consisting of chromium, molybdenum, copper, titanium, tungsten, aluminum, and combinations thereof. In one embodiment, the layer for producing the gate electrode 104 may be deposited by physical vapor deposition (PVD). In another embodiment, the layer for producing the gate electrode 104 may be deposited by evaporation. In another embodiment, the layer for producing the gate electrode 104 may be deposited by electroplating. It is to be understood that other deposition methods may be used to deposit the layer for producing the gate electrode 104. In one embodiment, the gate electrode 104 may have a thickness of between about 2000 Angstroms to about 3000 Angstroms. It is to be understood that the thickness of the gate electrode 104 may be adjusted to suit the device requirements.

Over the gate electrode 104, a gate dielectric layer 106 is formed. In one embodiment, the gate dielectric layer 106 may be deposited by PECVD. In another embodiment, the gate dielectric layer 106 may be deposited by chemical vapor deposition (CVD). It is to be understood that other deposition methods may be utilized to deposit the gate dielectric layer 106. In one embodiment, the gate dielectric layer 106 may comprise an insulating material. In another embodiment, the gate dielectric layer 106 may comprise silicon nitride. In another embodiment, the gate dielectric layer 106 may comprise silicon oxynitride. In another embodiment, the gate dielectric layer 106 may comprise silicon oxide. In another embodiment, the gate dielectric layer 106 may comprise silicon dioxide. In one embodiment, the gate dielectric layer 106 may have a thickness of between about 1000 Angstroms to about 6000 Angstroms. In another embodiment, the thickness of the gate dielectric layer 106 may be between about 2000 Angstroms and about 4000 Angstroms. In one embodiment, the gate dielectric layer 106 may comprise multiple layers. When multiple layers are used for the gate dielectric layer 106, one of the layers may be a high deposition rate material, such as silicon nitride with poor quality, and another of the layers may comprise a low deposition rate material, such as silicon nitride with high quality, to gain the throughput and the interface quality of an amorphous silicon TFT at the same time.

Once the gate dielectric layer 106 has been deposited, a semiconductor layer 108 may be deposited. In one embodiment, the semiconductor layer 108 may comprise silicon. In another embodiment, the semiconductor layer 108 may comprise amorphous silicon. In another embodiment, the semiconductor layer 108 may comprise intrinsic silicon. In another embodiment, the semiconductor layer 108 may comprise intrinsic amorphous silicon. In another embodiment, the semiconductor layer 108 may comprise microcrystalline silicon. In one embodiment, the semiconductor layer 108 may be deposited by PECVD. It is to be understood that the semiconductor layer 108 may be deposited by other deposition methods as well. In one embodiment, the semiconductor layer 108 may have a thickness of between about 300 Angstroms to about 3000 Angstroms.

Figure 2:
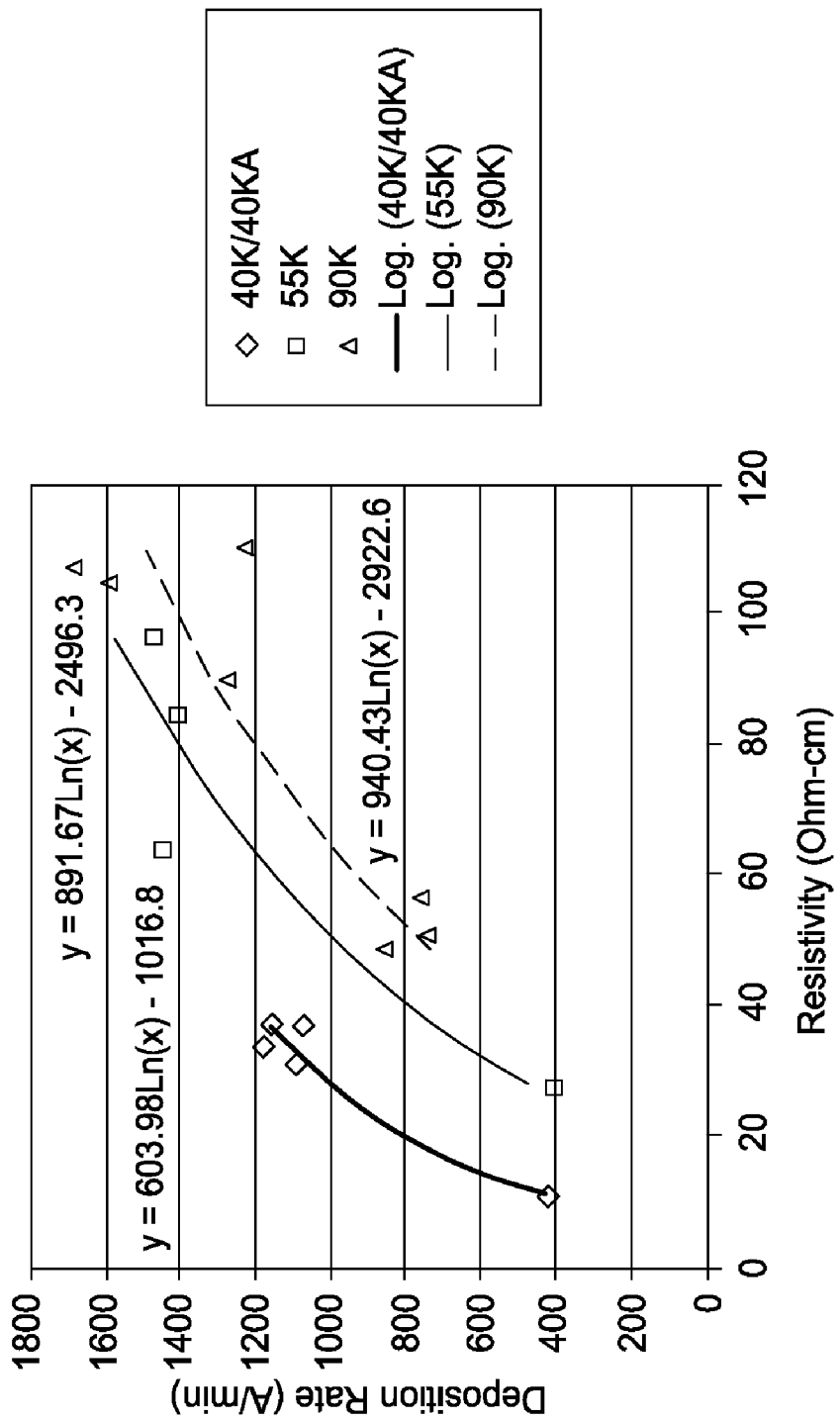
FIG. 2 is a graph showing the deposition rate versus resistivity for several chambers according to one embodiment.

In order to improve the electrical contact between the semiconductor layer 108 and the source and drain electrodes to be formed later, one or more doped semiconductor layers may be deposited on the semiconductor layer 108. One way to ensure good electrical contact is to lower the resistivity. To lower the resistivity, the deposition rate can simply be lowered. However, as discussed above, lowering the deposition rate will affect the substrate throughput. FIG. 2 is a graph showing the deposition rate versus resistivity for several chambers according to one embodiment. As the chamber size has increased from a chamber processing a substrate having a surface area of about 40,000 $cm^2$ (i.e., 40 K/40 KA) to a chamber for processing a substrate having a surface area of about 55,000 $cm^2$ (i.e., 55 K) to a chamber for processing a substrate having a surface area of about 90,000 $cm^2$ (i.e., 90 K), the same, low deposition rate does not produce the same, low resistivity. Rather, as the chamber size has increased, so has the resistivity in a single, doped semiconductor layer. In general, the doped semiconductor layer is not very thick. Therefore, a dual or multi-layer doped semiconductor material may be used. The layer that contacts the semiconductor layer 108 may be deposited at a high rate and thus have a high resistivity while the layer that is in contact with the source and drain electrodes may be deposited at a low rate to have a low resistivity. Thus, the dual or multi-layer doped semiconductor material has the advantage of making a nice ohmic contact from the semiconductor layer 108, which may be referred to as a channel layer of amorphous silicon, to the source and drain electrodes, which may comprise aluminum based materials. In one embodiment, the dual or multi-layer doped semiconductor layers may have a total resistivity of less than about 100 Ωcm. In another embodiment, the dual or multi-layer doped semiconductor layers may have a total resistivity of less than about 50 Ωcm. In one embodiment, the total resistivity for the structure 100 may be less than about 200 Ωcm.

Figure 1C:
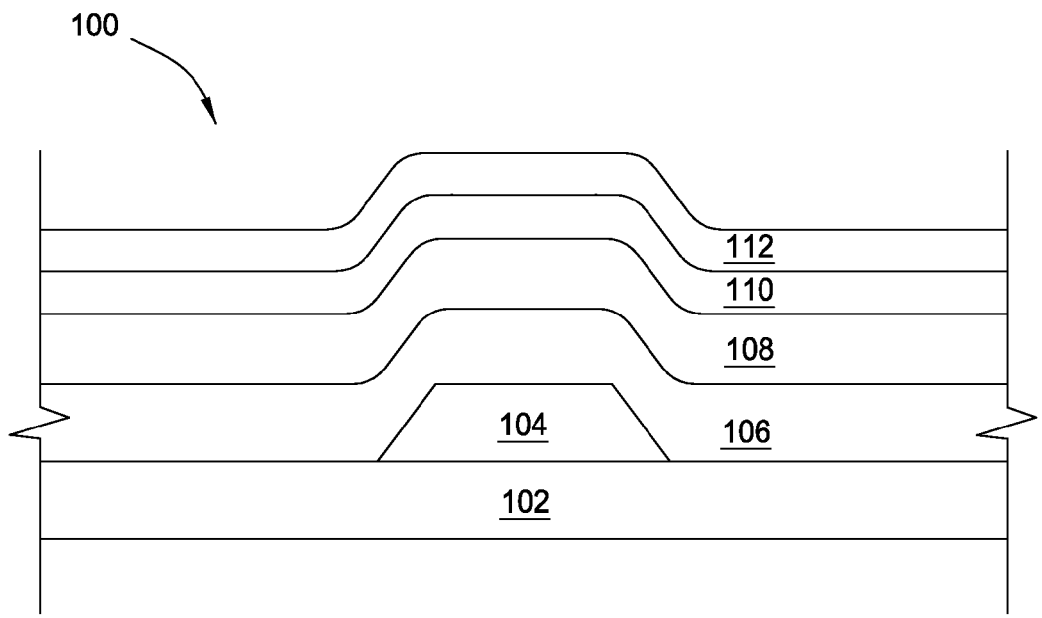

FIG. 1C shows the structure 100 in which two doped semiconductor layers 110, 112 have been deposited over the semiconductor layer 108. It is to be understood that while only two layers have been shown, more doped semiconductor layers may be present. In one embodiment, three doped semiconductor layers are present. In another embodiment, five doped semiconductor layers are present. In another embodiment, a single layer may be present in which the resistivity of the layer gradually decreases throughout the thickness. When multiple layers are used for the doped semiconductor layers, each layer may be deposited using different deposition conditions. For example, the deposition rate may be different, the flow rate of the gases may be different, the chamber pressure may be different and the power applied may be different.

In one embodiment, the doped semiconductor layers 110, 112 may comprise silicon. In another embodiment, the doped semiconductor layers 110, 112 may comprise amorphous silicon. In another embodiment, the doped semiconductor layers 110, 112 may comprise microcrystalline silicon. In another embodiment, the doped semiconductor layers 110, 112 may comprise intrinsic silicon. In another embodiment, the doped semiconductor layers 110, 112 may comprise intrinsic amorphous silicon. In one embodiment, the doped semiconductor layers 110, 112 may be deposited by PECVD. In one embodiment, the dopant may comprise phosphorus. In one embodiment, the doped semiconductor layers 110, 112 may have a collective thickness of between about 250 Angstroms and about 575 Angstroms. In one embodiment, the first doped semiconductor layer 110 may have a thickness of between about 75 Angstroms to about 100 Angstroms. In one embodiment, the second doped semiconductor layer 112 may have a thickness of between about 200 Angstroms to about 500 Angstroms.

TABLE 1

| Test Run | Thickness (Angstroms) | Deposition Rate (Angstroms/Minute) | Deposition Time (Seconds) | Resistivity (Ωcm) |
| --- | --- | --- | --- | --- |
| 1 | 550 | 300 | 110.0 | 37 |
| 2 | 550 | 800 | 41.3 | 56 |
| 3 | 550 | 2000 | 16.5 | 116 |
| 4 | 300 | 300 | 60.0 | 37 |
| 5 | 300 | 800 | 22.5 | 56 |
| 6 | 300 | 2000 | 9.0 | 116 |

Table 1 shows the results for six test runs where a single, doped semiconductor layer is deposited. Test Runs 1-3 each deposited a single, doped semiconductor layer to a thickness of 550 Angstroms, but the deposition rate, time and resistivity were different. Similarly, Test Runs 4-6 each deposited a single, doped semiconductor layer to a thickness of 300 Angstroms, but the deposition rate, time and resistivity were different. Both Test Run 1 and Test Run 4 produced very good resistivities at 300 Angstroms per minute, but the deposition uniformity was poor. Both Test Run 2 and Test Run 5 also produced acceptable resistivities, but again the deposition uniformity was poor. Test Runs 3 and 6 produced unacceptable results because the resistivity was above 100.

TABLE 2

| Test Run | Layer | Thickness (Angstroms) | Deposition Rate (Angstroms/Minute) | Deposition Time (Seconds) | Resistivity (Ωcm) |
| --- | --- | --- | --- | --- | --- |
| 1 | Top | 150 | 300 | 30.0 | 37 |
|   | Bottom | 400 | 2000 | 12.0 | 116 |
|   | Total | 550 |  | 42.0 | 94 |
| 2 | Top | 400 | 300 | 80.0 | 37 |
|   | Bottom | 150 | 2000 | 4.5 | 116 |
|   | Total | 550 |  | 84.5 | 59 |
| 3 | Top | 80 | 300 | 16.0 | 37 |
|   | Bottom | 220 | 2000 | 6.6 | 116 |
|   | Total | 300 |  | 22.6 | 95 |
| 4 | Top | 225 | 300 | 45.0 | 37 |
|   | Bottom | 75 | 2000 | 2.3 | 116 |
|   | Total | 300 |  | 47.3 | 57 |

Table 2 shows four test runs in which the doped semiconductor layer is deposited as a dual layer. For each of the test runs, the bottom layer is the layer deposited directly on the semiconductor layer and the top layer is the layer upon which the source and drain electrodes will be formed. In each test run, the top layer is deposited at a deposition rate of 300 Angstroms per minute for a resistivity of 37 Ωcm, and the bottom layer is deposited at a deposition rate of 2000 Angstroms per minute for a resistivity of 116 Ωcm. In Test Run 1, the top layer is deposited for 30 seconds while the bottom layer is deposited for 12 seconds for a total deposition time of 42 seconds and a total resistivity of 94 Ωcm. In Test Run 2, the top layer is deposited for 80 seconds while the bottom layer is deposited for 4.5 seconds for a total deposition time of 84.5 seconds and a total resistivity of 59 Ωcm. In Test Run 3, the top layer is deposited for 16 seconds and the bottom layer is deposited for 6.6 seconds for a total deposition time of 22.6 seconds and a resistivity of 95 Ωcm. In Test Run 4, the top layer is deposited for 45 seconds and the bottom layer is deposited for 2.3 seconds for a total deposition time of 47.3 seconds and a resistivity of 57 Ωcm. Additionally, the uniformity of the deposition was very good. Thus, in each scenario of Test Runs 1-4 of Table 2, the total resistivity of the multilayer doped semiconductor material was within the acceptable range of les than 100 Ωcm. Additionally, the deposition time for each layer can be tailored so that a predetermined resistivity can be achieved. Therefore, the data in Table 2 shows that it is possible to achieve both film thickness uniformity, low resistivity and high deposition rates because the deposition rate for Table 2 averages out to about 800 Angstroms per minute.

When the doped semiconductor layers 110, 112 are silicon, the doped semiconductor layers 110, 112 may be different materials. In one embodiment, both doped semiconductor layers 110, 112 comprise amorphous silicon. In another embodiment, the first doped semiconductor layer 110 comprises amorphous silicon and the second doped semiconductor layer 112 comprises microcrystalline silicon. In another embodiment, both doped semiconductor layers 110, 112 comprise amorphous silicon. In another embodiment, both doped semiconductor layers 110, 112 comprise microcrystalline silicon. In order to deposit the silicon layers, a silicon containing gas such as silane is introduced to the processing chamber. In one embodiment, the silane gas may be introduced at a flow rate of between about 13000 sccm and about 15000 sccm. Hydrogen gas may also be delivered at a flow rate of between about 70000 sccm and about 85000 sccm, PH$_3$ gas (i.e., the dopant) may be diluted in hydrogen gas (i.e., 0.5 percent PH$_3$, 99.5 percent hydrogen) and introduced at a total flow rate of between about 9000 sccm and about 11000 sccm. The PH$_3$ gas, in general, may be delivered at a flow rate of between about 45 sccm to about 55 sccm. In one embodiment, the PH$_3$ gas may be delivered at a flow rate of about 50 sccm. In another embodiment, the PH$_3$ gas may be delivered at a flow rate of about 250 sccm. RF power of between about 2500 W and about 3200 W may be applied to a showerhead. A chamber pressure of between about 2 Torr and about 3 Torr and a spacing between the showerhead and the substrate of between about 500 mils and about 700 mils may be maintained. In one particular embodiment, silane is delivered at 14,500 sccm, hydrogen is delivered at 70,050 sccm, diluted PH$_3$ gas (0.5 percent PH$_3$) is delivered at 10,000 sccm, the RF power is 3000 W, the pressure is 2.3 Torr, the spacing is 600 mils and the deposition time is 420 seconds for a deposition rate of 308 Angstroms per minute. In another embodiment, silane is delivered at 13,550 sccm, hydrogen is delivered at 80,000 sccm, diluted PH$_3$ gas (0.5 percent PH$_3$) is delivered at a ratio to silane gas of 1000:1, the RF power is 3000 W, the pressure is 2.3 Torr, the spacing is 600 mils and the deposition time is 480 seconds for a deposition rate of about 300 Angstroms per minute. In another embodiment, silane is delivered at 25,000 sccm, hydrogen is delivered at 50,000 sccm, diluted PH$_3$ gas (0.5 percent PH$_3$) is delivered at 50,000 sccm, the RF power is 22,000 W, the pressure is 2.3 Torr, the spacing is 600 mils and the deposition time is 60 seconds for a deposition rate of 1957 Angstroms per minute. In another embodiment, silane is delivered at 20,375 sccm, hydrogen is delivered at 99,625 sccm, diluted PH$_3$ gas (0.5 percent PH$_3$) is delivered at a ratio to silane gas of 7500:1, the RF power is 20,000 W, the pressure is 2.3 Torr, the spacing is 600 mils and the deposition time is 85 seconds for a deposition rate of about 2000 Angstroms per minute.

In one embodiment, doped semiconductor layer 110 may be deposited under the following conditions: a deposition rate of between about 800 Angstroms per minute and about 4000 Angstroms per minute, a deposition time of between a few seconds and about 30 seconds to produce a first doped silicon layer having a resistivity of between about 70 Ωcm to about 300 Ωcm. In another embodiment, the doped semiconductor layer 110 may be deposited under the following conditions: a deposition rate of between about 1800 Angstroms per minute and about 2200 Angstroms per minute, a deposition time of between about 10 seconds and about 15 seconds to produce a first doped silicon layer having a resistivity of between about 110 106 cm to about 120 Ωcm. In another embodiment, the deposition may occur for between about 5 seconds and about 10 seconds.

In one embodiment, the doped semiconductor layer 112 may be deposited under the following conditions: a deposition rate of between about 50 Angstroms per minute and about 800 Angstroms per minute for a deposition time of between about 15 seconds to about 300 seconds to produce the second doped silicon layer having a resistivity of between about 10 Ωcm to about 70 Ωcm. In another embodiment, the doped semiconductor layer 112 may be deposited under the following conditions: a deposition rate of between about 280 Angstroms per minute and about 320 Angstroms per minute for a deposition time of between about 25 seconds to about 35 seconds to produce the second doped silicon layer having a resistivity of between about 30 Ωcm to about 40 Ωcm. In another embodiment, the deposition may occur for between about 10 seconds and about 18 seconds.

In one embodiment, the doped semiconductor layer 112 may be deposited under the following conditions: introducing silane gas at a flow rate of between about 5000 sccm and about 20000 sccm, introducing hydrogen gas at a flow rate of between about 0 sccm and about 200000 sccm, introducing 0.5 percent PH$_3$ in H$_2$ at a flow rate of between about 1000 sccm and about 200000 sccm, applying an RF power to a showerhead of between about 500 W and about 15000 W, maintaining a chamber pressure of between about 1 Torr and about 5 Torr and a spacing between the showerhead and the substrate of between about 400 mils and about 1200 mils. In another embodiment, the doped semiconductor layer 112 may be deposited under the following conditions: introducing silane gas at a flow rate of between about 13000 sccm and about 15000 sccm, introducing hydrogen gas at a flow rate of between about 70000 sccm and about 85000 sccm, introducing 0.5 percent PH$_3$ in H$_2$ at a flow rate of between about 9000 sccm and about 11000 sccm, applying an RF power to a showerhead of between about 2500 W and about 3200 W, maintaining a chamber pressure of between about 2 Torr and about 3 Torr and a spacing between the showerhead and the substrate of between about 500 mils and about 700 mils.

In another embodiment, the doped semiconductor layer 112 may be deposited under the following conditions: introducing silane gas at a flow rate of between about 5000 sccm and about 50000 sccm, introducing hydrogen gas at a flow rate of between about 0 sccm and about 150000 sccm, introducing 0.5 percent PH$_3$ in H$_2$ at a flow rate of between about 1000 sccm and about 150000 sccm, applying an RF power to a showerhead of between about 10000 W and about 40000 W, maintaining a chamber pressure of between about 1 Torr and about 5 Torr and a spacing between the showerhead and the substrate of between about 400 mils and about 1200 mils. In another embodiment, the doped semiconductor layer 112 may be deposited under the following conditions: introducing silane gas at a flow rate of between about 20000 sccm and about 26000 sccm, introducing hydrogen gas at a flow rate of between about 50000 sccm and about 100000 sccm, introducing diluted PH$_3$ gas (0.5 percent PH$_3$) at a flow rate of between about 45000 sccm and about 52000 sccm, applying an RF power to a showerhead of between about 20000 W and about 23000 W, maintaining a chamber pressure of between about 2 Torr and about 3 Torr and a spacing between the showerhead and the substrate of between about 500 mils and about 700 mils.

Figure 1D:
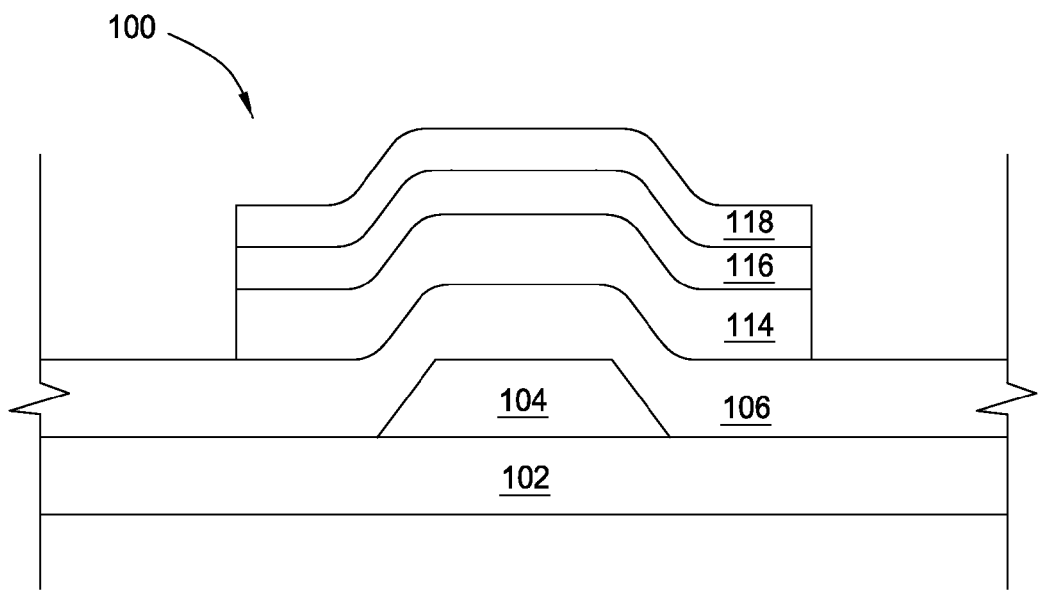
Figure 1E:
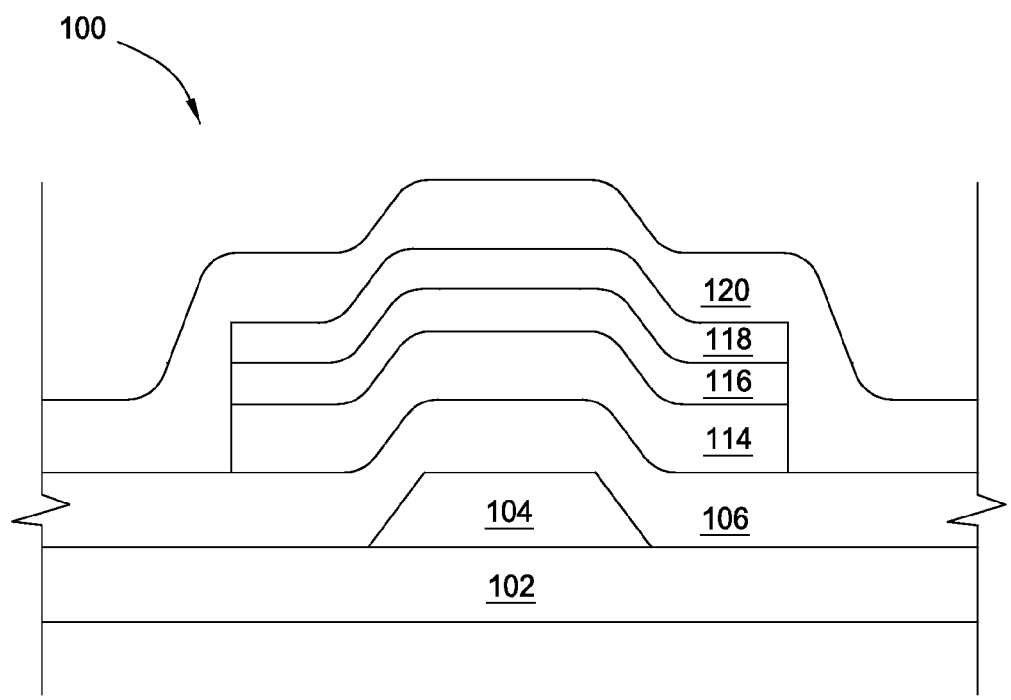

After the doped semiconductor layers 110, 112 have been deposited, the doped semiconductor layers 110, 112 and the semiconductor layer 108 may be patterned. To pattern the semiconductor layer 108 and the doped semiconductor layers 110, 112, a mask may be formed thereover and the layers etched. Once the layers are etched, then the mask is removed to leave an etched semiconductor layer 114 and etched doped semiconductor layers 116, 118 as shown in FIG. 1D.

Figure 1F:
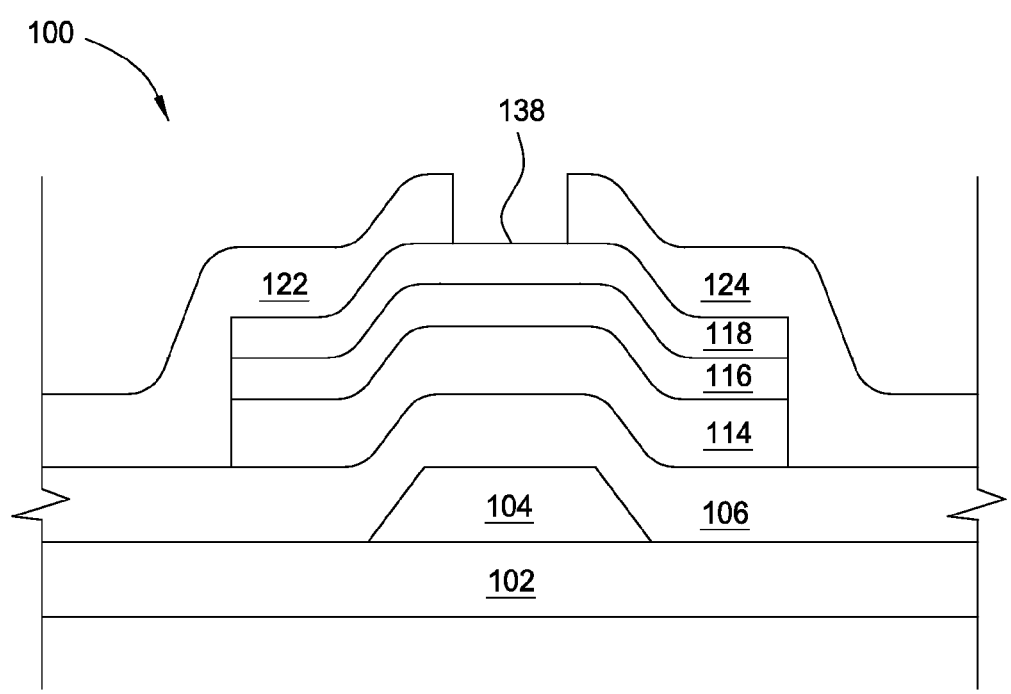

A metal layer 120 may then be deposited over the structure 100. The metal layer 120 will become the source and drain electrodes. In another embodiment, the metal layer may comprise tungsten, molybdenum, titanium, chromium, aluminum, alloys thereof and combinations thereof. The metal layer 120 may be deposited by well known deposition methods such as PVD. The metal layer 120 is then patterned by forming a mask thereover, etching and removing the mask to leave a source electrode 122 and a drain electrode 124 and an exposed surface 138 of the topmost etched doped semiconductor layer 118 as shown in FIG. 1F.

Figure 1G:
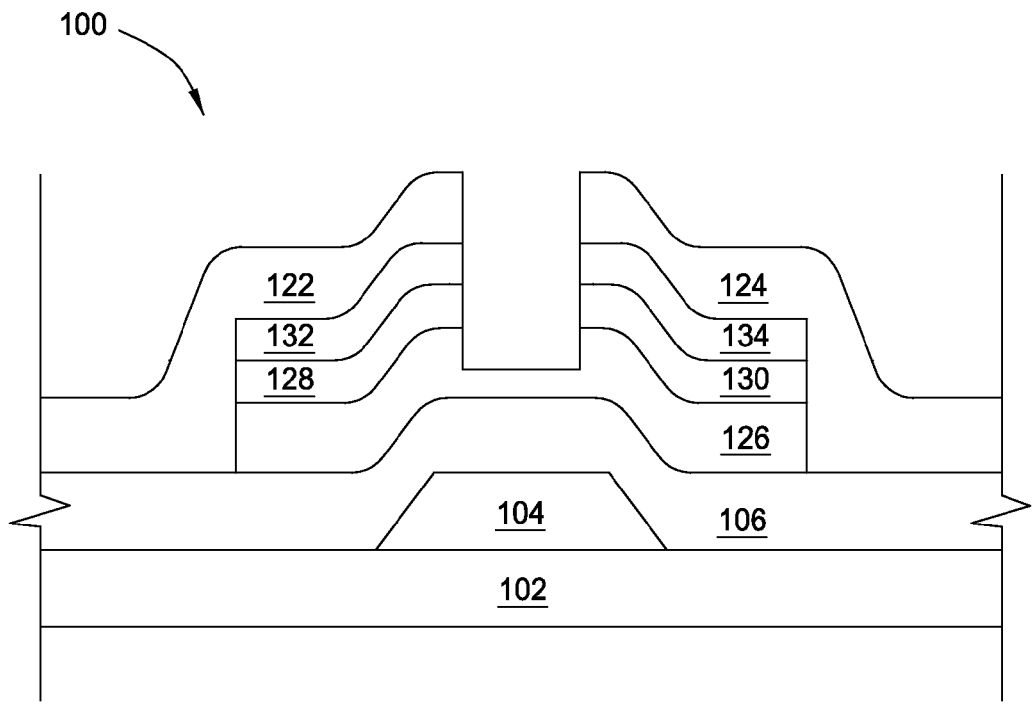
Figure 1H:
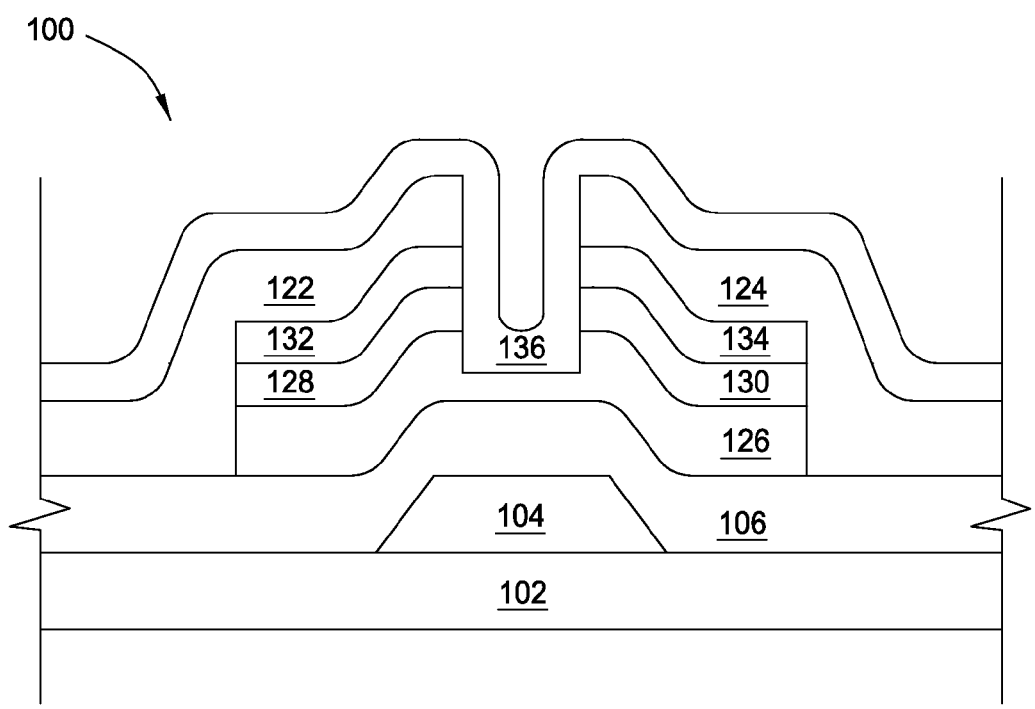

Following formation of the source electrode 122 and the drain electrode 124, the etched semiconductor layer 114 will need to be exposed. In order to expose the etched semiconductor layer 114, portions of the etched doped semiconductor layers 116, 118 will need to be removed. In order to remove portions of the etched doped semiconductor layers 116, 118, either a mask may be formed over the source electrode 122 and drain electrode 124, or the source electrode 122 and drain electrode 124 may be used as a mask. If a mask is deposited, the mask will be removed following etching. In any event, the etched doped semiconductor layers 116, 118 are etched to leave patterned doped semiconductor portions 128, 130, 132, 134. Additionally, the etched semiconductor layer 114 is exposed and partially etched to form a patterned semiconductor layer 126 as shown in FIG. 1G. Thereafter, a passivation layer 136 may be deposited over the entire structure 100 as shown in FIG. 1H. In one embodiment, the passivation layer 136 may comprise an insulating material. In another embodiment, the passivation layer 136 may comprise silicon nitride. In another embodiment, the passivation layer 136 may comprise silicon oxide. In another embodiment, the passivation layer 136 may comprise silicon dioxide. In another embodiment, the passivation layer 136 may comprise silicon oxynitride. In one embodiment, the passivation layer 136 is deposited by PECVD.

The advantage of depositing the doped semiconductor layer as multiple layers or as a single, graded layer is that the layer may be tailored to suit the requirements of the production facility without sacrificing substrate throughput. The resistivity can be controlled to be sufficiently low, and the substrate throughput may be maintained at an acceptable level. Another advantage of the embodiments discussed herein is that formation of an ohmic contact using highly conductive material between the semiconductor material layer and the metal layer (i.e., source and drain electrodes). In particular, having a highly conductive ohmic contact material reduces the thickness of the ohmic contact layer because the resistance of the contact layer should have enough conductivity without having to have thick material, which should be favorable in terms of throughput.

While the foregoing is directed to embodiments of the present invention, other and further embodiments of the invention may be devised without departing from the basic scope thereof, and the scope thereof is determined by the claims that follow.

The invention claimed is:

1. A thin film transistor fabrication method, comprising:
depositing an amorphous silicon layer over a substrate having a gate electrode and a gate dielectric layer formed thereon;
depositing two or more doped silicon layers over the amorphous silicon layer, each doped silicon layer having at least one characteristic that is different than the other doped silicon layers, wherein depositing the two or more doped silicon layers comprises:
    depositing a first doped silicon layer on the amorphous silicon layer under first deposition conditions, wherein the first deposition conditions comprise a deposition rate of between about 800 Angstroms per minute and about 4000 Angstroms per minute, a deposition time of up to about 30 seconds to produce a first doped silicon layer having a resistivity of between about 70 Ωcm to about 3000 Ωcm; and
    depositing a second doped silicon layer on the first doped silicon layer under second deposition conditions different than the first deposition conditions, wherein the second deposition conditions comprise a deposition rate of between about 50 Angstroms per minute and about 800 Angstroms per minute for a deposition time of between about 15 seconds to about 3000 seconds to produce the second doped silicon layer having a resistivity of between about 10 Ωcm to about 70 Ωcm;
depositing a metal layer over the two or more doped silicon layers;
patterning the metal layer to form a source electrode and a drain electrode;
patterning the two or more doped silicon layers to expose the amorphous silicon layer; and
depositing a passivation layer over the source electrode, the drain electrode and the exposed amorphous silicon layer.

2. A thin film transistor fabrication method, comprising:
depositing an amorphous silicon layer over a substrate having a gate electrode and a gate dielectric layer formed thereon;
depositing two or more doped silicon layers over the amorphous silicon layer, each doped silicon layer having at least one characteristic that is different than the other doped silicon layers, wherein depositing the two or more doped silicon layers comprises:
    depositing a first doped silicon layer on the amorphous silicon layer under first deposition conditions, wherein the first deposition conditions comprise a deposition rate of between about 1800 Angstroms per minute and about 2200 Angstroms per minute, a deposition time of between about 5 seconds and about 10 seconds to produce a first doped silicon layer having a resistivity of between about 110 Ωcm to about 120 Ωcm; and
    depositing a second doped silicon layer on the first doped silicon layer under second deposition conditions different than the first deposition conditions, wherein, the second deposition conditions comprise a deposition rate of between about 280 Angstroms per minute and about 320 Angstroms per minute for a deposition time of between about 10 seconds to about 18 seconds to produce the second doped silicon layer having a resistivity of between about 30 Ωcm to about 40 Ωcm;
depositing a metal layer over the two or more doped silicon layers;
patterning the metal layer to form a source electrode and a drain electrode;
patterning the two or more doped silicon layers to expose the amorphous silicon layer; and
depositing a passivation layer over the source electrode, the drain electrode and the exposed amorphous silicon layer.

3. A thin film transistor fabrication method, comprising:
depositing an amorphous silicon layer over a substrate having a gate electrode and a gate dielectric layer formed thereon;
depositing two or more doped silicon layers over the amorphous silicon layer, each doped silicon layer having at least one characteristic that is different than the other doped silicon layers, wherein depositing the two or more doped silicon layers comprises:
    depositing a first doped silicon layer on the amorphous silicon layer under first deposition conditions; and
    depositing a second doped silicon layer on the first doped silicon layer under second deposition conditions different than the first deposition conditions, wherein, the second deposition comprises introducing silane gas at a flow rate of between about 5000 sccm and about 20000 sccm, introducing hydrogen gas at a flow rate of up to about 200000 sccm, introducing 0.5 percent $PH_3$ in $H_2$ at a flow rate of between about 1000 sccm and about 200000 sccm, applying an RF power to a showerhead of between about 500 W and about 15000 W, maintaining a chamber pressure of between about 1 Torr and about 5 Torr and a spacing between the showerhead and the substrate of between about 400 mils and about 1200 mils;

depositing a metal layer over the two or more doped silicon layers;

patterning the metal layer to form a source electrode and a drain electrode;

patterning the two or more doped silicon layers to expose the amorphous silicon layer; and depositing a passivation layer over the source electrode, the drain electrode and the exposed amorphous silicon layer.

4. A thin film transistor fabrication method, comprising:

depositing an amorphous silicon layer over a substrate having a gate electrode and a gate dielectric layer formed thereon;

depositing two or more doped silicon layers over the amorphous silicon layer, each doped silicon layer having at least one characteristic that is different than the other doped silicon layers, wherein depositing the two or more doped silicon layers comprises:

depositing a first doped silicon layer on the amorphous silicon layer under first deposition conditions; and depositing a second doped silicon layer on the first doped silicon layer under second deposition conditions different than the first deposition conditions, wherein the second deposition comprises introducing silane gas at a flow rate of between about 5000 sccm and about 50000 sccm, introducing hydrogen gas at a flow rate of up to about 150000 sccm, introducing 0.5 percent PH$_3$ in H$_2$ at a flow rate of between about 1000 sccm and about 150000 sccm, applying an RF power to a showerhead of between about 10000 W and about 40000 W, maintaining a chamber pressure of between about 1 Torr and about 5 Torr and a spacing between the showerhead and the substrate of between about 400 mils and about 1200 mils;

depositing a metal layer over the two or more doped silicon layers;

patterning the metal layer to form a source electrode and a drain electrode;

patterning the two or more doped silicon layers to expose the amorphous silicon layer; and depositing a passivation layer over the source electrode, the drain electrode and the exposed amorphous silicon layer.

5. A thin film transistor fabrication method, comprising:

depositing an amorphous silicon layer over a substrate having a gate electrode and a gate dielectric layer formed thereon;

depositing a first doped silicon layer having a first resistivity on the amorphous silicon layer at a first deposition rate, wherein the first doped silicon layer is deposited under first deposition conditions that comprise a deposition rate of between about 800 Angstroms per minute and about 4000 Angstroms per minute, a deposition time of up to about 30 seconds to produce a first doped silicon layer having a resistivity of between about 70 Ωcm to about 300 Ωcm;

depositing a second doped silicon layer having a second resistivity less than the first resistivity on the first doped silicon layer, the second doped silicon layer deposited at a second deposition rate less than the first deposition rate, wherein the second doped silicon layer is deposited under second deposition conditions that comprise a deposition rate of between about 50 Angstroms per minute and about 800 Angstroms per minute for a deposition time of between about 15 seconds to about 300 seconds to produce the second doped silicon layer having a resistivity of between about 10 Ωcm to about 70 Ωcm;

depositing a metal layer over the second doped silicon layer;

patterning the metal layer to form a source electrode and a drain electrode;

patterning the first doped silicon layer and the second doped silicon layer to expose the amorphous silicon layer; and depositing a passivation layer over the source electrode, the drain electrode and the exposed amorphous silicon layer.

6. A thin film transistor fabrication method, comprising:

depositing an amorphous silicon layer over a substrate having a gate electrode and a gate dielectric layer formed thereon;

depositing a first doped silicon layer having a first resistivity on the amorphous silicon layer at a first deposition rate, wherein the first doped silicon layer is deposited under first deposition conditions that comprise a deposition rate of between about 1800 Angstroms per minute and about 2200 Angstroms per minute, a deposition time of between about 5 seconds and about 10 seconds to produce a first doped silicon layer having a resistivity of between about 110 Ωcm to about 120 Ωcm;

depositing a second doped silicon layer having a second resistivity less than the first resistivity on the first doped silicon layer, the second doped silicon layer deposited at a second deposition rate less than the first deposition rate, wherein the second doped silicon layer is deposited under second deposition conditions that comprise a deposition rate of between about 280 Angstroms per minute and about 320 Angstroms per minute for a deposition time of between about 10 seconds to about 18 seconds to produce the second doped silicon layer having a resistivity of between about 30 Ωcm to about 40 Ωcm;

depositing a metal layer over the second doped silicon layer;

patterning the metal layer to form a source electrode and a drain electrode;

patterning the first doped silicon layer and the second doped silicon layer to expose the amorphous silicon layer; and depositing a passivation layer over the source electrode, the drain electrode and the exposed amorphous silicon layer.

7. A thin film transistor fabrication method, comprising:

depositing an amorphous silicon layer over a substrate having a gate electrode and a gate dielectric layer formed thereon;

depositing a first doped silicon layer having a first resistivity on the amorphous silicon layer at a first deposition rate;

depositing a second doped silicon layer having a second resistivity less than the first resistivity on the first doped silicon layer, the second doped silicon layer deposited at a second deposition rate less than the first deposition rate, wherein the second doped silicon layer is deposited under deposition conditions that comprise introducing silane gas at a flow rate of between about 5000 sccm and about 20000 sccm, introducing hydrogen gas at a flow rate of up to about 200000 sccm, introducing 0.5 percent PH$_3$ in H$_2$ at a flow rate of between about 1000 sccm and about 200000 sccm, applying an RF power to a showerhead of between about 500 W and about 15000 W, maintaining a chamber pressure of between about 1 Torr and about 5 Torr and a spacing between the showerhead and the substrate of between about 400 mils and about 1200 mils;

depositing a metal layer over the second doped silicon layer;

patterning the metal layer to form a source electrode and a drain electrode;

patterning the first doped silicon layer and the second doped silicon layer to expose the amorphous silicon layer; and depositing a passivation layer over the source electrode, the drain electrode and the exposed amorphous silicon layer.

8. A thin film transistor fabrication method, comprising:

depositing an amorphous silicon layer over a substrate having a gate electrode and a gate dielectric layer formed thereon;

depositing a first doped silicon layer having a first resistivity on the amorphous silicon layer at a first deposition rate;

depositing a second doped silicon layer having a second resistivity less than the first resistivity on the first doped silicon layer, the second doped silicon layer deposited at a second deposition rate less than the first deposition rate, wherein the second doped silicon layer is deposited under deposition conditions that comprise introducing silane gas at a flow rate of between about 5000 sccm and about 50000 sccm, introducing hydrogen gas at a flow rate of up to about 150000 sccm, introducing 0.5 percent $PH_3$ in $H_2$ at a flow rate of between about 1000 sccm and about 150000 sccm, applying an RF power to a showerhead of between about 10000 W and about 40000 W, maintaining a chamber pressure of between about 1 Torr and about 5 Torr and a spacing between the showerhead and the substrate of between about 400 mils and about 1200 mils;

depositing a metal layer over the second doped silicon layer;

patterning the metal layer to form a source electrode and a drain electrode;

patterning the first doped silicon layer and the second doped silicon layer to expose the amorphous silicon layer; and depositing a passivation layer over the source electrode, the drain electrode and the exposed amorphous silicon layer.

\* \* \* \* \*

UNITED STATES PATENT AND TRADEMARK OFFICE
CERTIFICATE OF CORRECTION

| | | |
|---|---|---|
| PATENT NO. | : 8,299,466 B2 | Page 1 of 1 |
| APPLICATION NO. | : 12/913846 | |
| DATED | : October 30, 2012 | |
| INVENTOR(S) | : Furuta et al. | |

It is certified that error appears in the above-identified patent and that said Letters Patent is hereby corrected as shown below:

In Detailed Description:

Column 7, Line 48, please delete "106" and insert --$\Omega$-- therefor.

Signed and Sealed this
Twelfth Day of March, 2013

Teresa Stanek Rea
*Acting Director of the United States Patent and Trademark Office*